United States Patent [19]
Yoshino et al.

[11] Patent Number: 5,376,897
[45] Date of Patent: Dec. 27, 1994

[54] DIFFERENTIAL AMPLIFIER CIRCUIT PROVIDING HIGH GAIN OUTPUT AT LOW POWER SUPPLY VOLTAGE

[75] Inventors: Hiroshi Yoshino, Yokohama; Sakiko Matsuo, Kawasaki, both of Japan

[73] Assignee: Kabushiki Kaisha Toshiba, Kawasaki, Japan

[21] Appl. No.: 171,644

[22] Filed: Dec. 22, 1993

[30] Foreign Application Priority Data

Dec. 24, 1992 [JP] Japan .................................. 4-343663

[51] Int. Cl.$^5$ ............................................... H03F 3/45
[52] U.S. Cl. ....................................... 330/252; 330/257
[58] Field of Search ............... 330/252, 255, 257, 260, 330/261

[56] References Cited
U.S. PATENT DOCUMENTS

| | | | |
|---|---|---|---|
| 4,547,744 | 10/1985 | Kasperkovitz | 330/252 X |
| 4,937,515 | 6/1990 | Yoshino . | |
| 5,132,640 | 7/1992 | Tanaka et al. | 330/257 X |

*Primary Examiner*—Steven Mottola
*Attorney, Agent, or Firm*—Oblon, Spivak, McClelland, Maier, & Neustadt

[57] ABSTRACT

A differential amplifier circuit having a differential pair including first and second transistors of a first conductivity type, emitters of which are connected to each other, a first current source circuit disposed between the emitters of said first and second transistors and a first power source, a second current source circuit disposed between a collector of the first transistor and a second power source, a third current source circuit disposed between a collector of the second transistor and the second power source, and an active load circuit including a third transistor of the first conductivity type, having a collector connected to the collector of the first transistor and an emitter connected to the first power source, a fourth transistor of the first conductivity type, having a collector connected to the collector of the second transistor and an emitter connected to the first power source, a first load resistor disposed between the collector of the third transistor and a common connection node of bases of the third and fourth transistors and a second load resistor disposed between the collector of the fourth transistor and the common connection node of the bases of the third and fourth transistors.

5 Claims, 2 Drawing Sheets

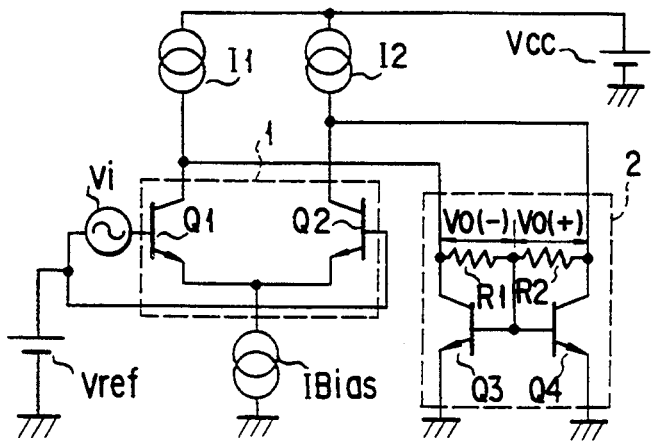
F I G. 2
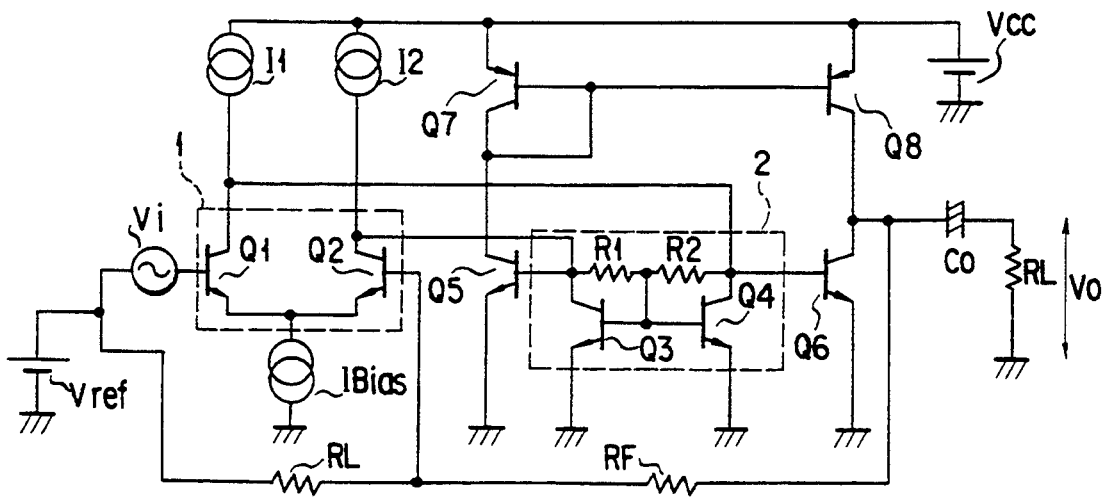
F I G. 3

DIFFERENTIAL AMPLIFIER CIRCUIT PROVIDING HIGH GAIN OUTPUT AT LOW POWER SUPPLY VOLTAGE

BACKGROUND OF THE INVENTION

1. Field of the Invention

The present invention relates to a differential amplifier circuit, which is capable of performing a low voltage operation and obtaining amplification having a high gain even under the power supply from a power source of a low voltage.

2. Description of the Related Art

As a differential amplification circuit, which performs a high gain differential amplification, there has been conventionally used a differential amplifier circuit as shown in FIG. 1.

More specifically, PNP transistors Q3 and Q4 are disposed between collectors of an input differential pair of NPN transistors Q1 and Q2 and a power source Vcc. Each collector of PNP transistors Q3 and Q4 is connected to each of the corresponding NPN transistors Q1 and Q2. The emitters of PNP transistors Q3 and Q4 are connected to the power source vcc. A load resistor R1 is connected between a contact point, which is between the collector of the NPN transistor Q1 and that of the PNP transistor Q3, and the bases of the PNP transistors Q3 and Q4. A load resistor R2 is connected between a contact point, which is between the collector of the NPN transistor Q2 and that of the PNP transistor Q4, and the bases of the PNP transistors Q3 and Q4.

The bases of the transistors Q1 and Q2 are connected to a reference power voltage Vref in common. The emitters of the transistors Q1 and Q2 are connected to a bias current source IBias.

In the conventional differential amplifier circuit of FIG. 1, since a current, which flows to the load resistor in a non-signal state, is used as a base current for the PNP transistors Q3 and Q4, voltage drop can be controlled to be small even if a relatively large resistor is used as a load resistor to obtain the amplifier having a high gain. Therefore, the differential amplifier circuit shown in FIG. 1 has been conventionally used as a high gain amplifier for a low voltage operation.

The following will explain a case in which the conventional differential amplifier circuit is used with a power voltage of about Vcc=0.9 V.

The voltage of each collector of the NPN transistors Q1 and Q2 is set to the value at which the base-emitter voltage VBE of the PNP transistors Q3 and Q4 forming an active load is dropped by 0.7 V from the power voltage vcc. Due to this, in order to set each collector-emitter voltage of the differential pair within a saturation voltage (vsat=0.15) of the transistor in a state that the power voltage vcc is 0.9 V, the voltage between the common emitter of the NPN transistors Q1 and Q2 and a pair ground voltage (common lowest voltage) must be set to 50 mv. Therefore, since the transistor having the saturation voltage Vsat cannot be used, the use of the transistor is limited to a current bias system using a resistor. This causes the bias current change of the differential pair due to the input bias voltage and the reduction of the voltage conversion gain to the input signal voltage. As a result, the characteristic of the differential amplifier circuit is deteriorated.

In the differential amplifier circuit of FIG. 1, the voltage VBE of the PNP transistors forming an active load is the voltage, which is dropped from the power voltage, so that there is no room for performing a reducing voltage operation by the output of each collector of the NPN transistors.

SUMMARY OF THE INVENTION

An object of the present invention is to provide a differential amplifier circuit as a high gain amplifier having a differential output, and a good characteristic even at a low power voltage of about Vcc=0.9 V.

A differential amplifier circuit according to the present invention comprises a differential pair including first and second transistors of a first conductivity type, emitters of which are connected to each other; a first current source circuit disposed between the emitters of said first and second transistors and a first power source; a second current source circuit disposed between a collector of the first transistor and a second power source, a third current source circuit disposed between a collector of the second transistor and the second power source; and an active load circuit including a third transistor of the first conductivity type, having a collector connected to the collector of the first transistor and an emitter connected to the first power source, a fourth transistor of the first conductivity type, having a collector connected to the collector of the second transistor and an emitter connected to the first power source, a first load resistor disposed between the collector of the third transistor and a common connection node of bases of the third and fourth transistors and a second load resistor disposed between the collector of the fourth transistor and the common connection node of the bases of the third and fourth transistors.

In the differential amplifier circuit having a construction as described above, the differential pair and an active load circuit are arranged in parallel to the second power voltage. Due to this, the collector voltage of the first and second transistors constituting the differential pair is fixed to the voltage, which is increased by 0.7 V of the forward bias voltage VBE of the base-emitter voltage of the third and fourth transistors.

Therefore, in a case where the collector-emitter saturation voltage VCE of the first and second transistors constituting the differential pair is fixed to 0.15 V, the voltage drop due to the first current source circuit can be set up to 0.55 V. There can be disposed a differential amplifier circuit, which can carries out the differential amplification having a high gain characteristic even in a low power voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a circuit diagram showing a first embodiment of a differential amplifier circuit according to the present invention;

FIG. 3 is a circuit diagram showing a modified construction of the circuit diagram shown in FIG. 2;

DETAILED DESCRIPTION OF THE PREFERRED EMBODIMENTS

Figure 1:
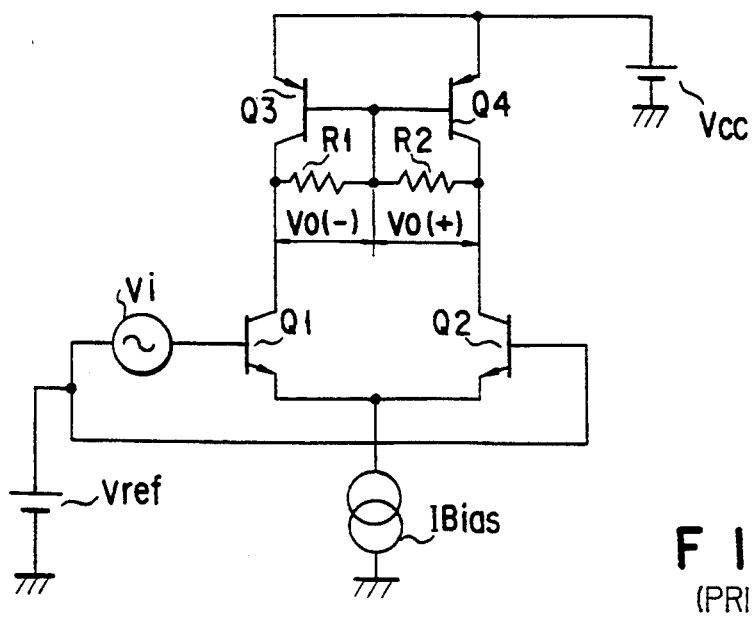
FIG. 1 is a circuit diagram showing a conventional differential amplifier circuit.

The differential amplifier circuit of the present invention will be explained with reference to the drawings.

FIG. 2 is a circuit diagram of the first embodiment of the differential amplifier circuit of the present invention.

In FIG. 2, Q1 an Q2 are NPN transistors constituting an input differential pair 1, and a current source circuit IBias comprising a resistor and a transistor is disposed between a common emitter of the transistors Q1 and Q2 and a ground. Each collector of NPN transistors Q1 and Q2 is connected to a power source circuit Vcc through constant current source circuits I1 and I2 comprising a transistor and a resistor.

An active load circuit 2 is disposed in the power source circuit Vcc so as to be parallel with the differential pair 1. The active load circuit 2 comprises a transistor Q3 having a base connected to the base of the transistor Q3, an emitter which is grounded, and a collector connected to a contact point between the transistor Q1 of the pair 1 and a constant current source circuit I1, a transistor Q4 having a base connected to the base of a transistor Q3, an emitter which is grounded, and a collector connected to a contact point between the transistor Q2 of the pair 1 and a constant current source circuit I2, a resistor R1 disposed between the collector of the transistor Q3 and its base, and a resistor R2 disposed between the collector of the transistor Q4 and its base.

Vref is a d.c. bias voltage power source for d.c. biasing the differential pair 1.

In the differential amplifier circuit of the present invention shown in FIG. 2, power its supplied to the differential pair 1 from the power source circuit Vcc via the constant current source circuit I1 and I2, and the differential amplifying operation is performed in accordance with the input from the d.c. bias voltage power source Vref.

Since the active load circuit 2 is disposed between the contact point, which is between the differential pair 1 and the constant current source circuits I1 and I2, and the ground, the collector voltage of the transistors Q1 and Q2 is fixed at 0.7 V, which is the base-emitter voltage VBE of the NPN transistors Q3 and Q4.

Therefore, if the collector-emitter saturation voltage VCE of the first and second transistors Q1 and Q2 constituting the differential pair 1 is fixed at 0.15 V, the voltage drop due to the first current source circuit IBias is equal to 0.55 V. In other words, the differential amplifying operation can be performed even in the low power voltage circuit Vcc, which is equal to 0.9 V. Therefore, there is disposed a differential amplifier circuit which can perform a differential amplifying operation having a good high gain characteristic even at a low power source voltage.

FIG. 3 shows an application of the differential amplifier circuit of the present invention shown in FIG. 2.

More specifically, FIG. 3 shows an example in which an emitter ground current amplifying stage having NPN transistors Q5 and Q6 and a current mirror circuit having transistors Q7 and Q8 are added to the differential amplifier circuit of FIG. 2, thereby obtaining a structure in which a negative feedback function is added.

In the differential amplifier circuit shown in FIG. 3, current amplification for operating transistors Q5 and Q6 constituting the emitter ground current amplifying stage is performed by the output of the differential pair 1. Due to this, even if the bias current, which is supplied to the transistors Q5 and Q6 constituting the emitter ground current amplifying stage from the differential pair 1, is controlled, the load driving capability is high. Moreover, the transistors Q3 and Q4 constituting the active load circuit 2 and the transistors Q7 and Q8 perform a current mirror operation at the time of non-signal. Due to this, it is possible to reduce the variation of the output current to the variation of the value of the resistors R1, R2 and that of the d.c. current gain.

Figure 4:
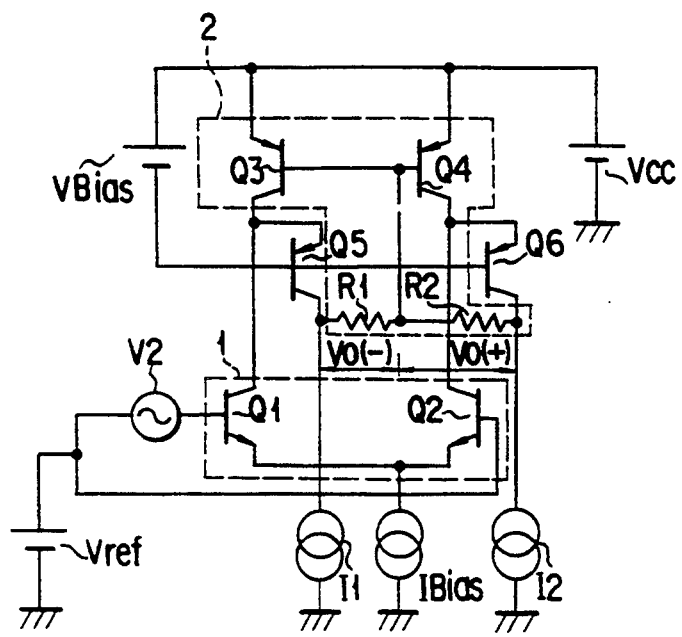
FIG. 4 is a circuit diagram of a second embodiment of a differential amplifier circuit according to the present invention.

FIG. 4 is a circuit diagram of the second embodiment of the differential amplifier circuit of the present invention.

In FIG. 4, Q1 and Q2 are NPN transistors constituting the input differential pair 1, the current source circuit IBias comprising the resistor and the transistor is disposed between the common emitter of the transistors Q1 and Q2 and the ground. Each collector of NPN transistors Q1 and Q2 is connected to the power source circuit vcc through PNP transistors Q3 and Q4 constituting the active load circuit 2.

The emitter of the PNP transistor Q5 is connected to the contact point between the collector of the transistor Q1 and that of the transistor Q3. The collector of the transistor Q5 is grounded through the constant current source circuit I1. The emitter of the PNP transistor Q6 is connected to the contact point between the collector of the transistor Q2 and that of the transistor Q4. The collector of the transistor Q6 is grounded through the constant current source circuit I2. The bases of the transistors Q5 and Q6 are grounded to the power source circuit VBias, which supplies the voltage, which is lower by the sum of the base-emitter voltage VBE of the transistor Q3 and the collector-emitter saturation voltage VCESAT of the transistor Q5 from the power source voltage of the power source circuit Vcc.

The resistor R1 is disposed between the collector of the transistor Q5 and the bases of the transistors Q3 and Q4, and the resistor R2 is disposed between the collector of the transistor Q6 and the bases of the transistors Q3 and Q4.

vref is a d.c. bias voltage power source for d.c. biasing the differential pair 1.

In the differential amplifier circuit of the present invention shown in FIG. 4, power is supplied to the differential pair 1 from the power source circuit Vcc via the transistors Q3 and Q4, and the differential amplifying operation is performed in accordance with the input from the d.c. bias voltage power source Vref.

The emitter of the transistor Q5 is connected to the contact point between the collector of the transistor Q3, which constitutes the active load circuit 2, and the transistor Q1, which constitutes the pair 1. The emitter of the transistor Q6 is connected to the contact point between the collector of the transistor Q4, which constitutes the active load circuit 2, and the transistor Q2, which constitutes the pair 1. The bases of the transistors Q5 and Q6 are grounded to the power source circuit, which applies a voltage, which is lower than the power source voltage of the power source circuit Vcc by the sum of the base-emitter voltage VBE of the transistor Q3 and the collector-emitter saturation voltage VCESAT of the transistor Q5. Due to this, the potential of the contact point between the collector of the transistor Q1 and the collector of the transistor Q3 and the potential of the contact point between the collector of the transistor Q2 and the collector of the transistor Q4 are fixed to the voltage, which is lower than the power source circuit vcc by the collector-emitter saturation voltage VCESAT of the transistors Q3 and Q4.

Therefore, if the collector-emitter saturation voltage VCE of the first and second transistors Q1 and Q2 constituting the differential pair 1 is fixed at 0.15 V, the voltage drop due to the first current source circuit IBias is equal to 0.55 V. In other words, the differential amplifying operation can be performed even with the low power voltage circuit vcc, which is equal to 0.9 V. Therefore, there is disposed a differential amplifier circuit which can perform a differential amplifying operation having a good high gain characteristic even at the low power source voltage.

Figure 5:
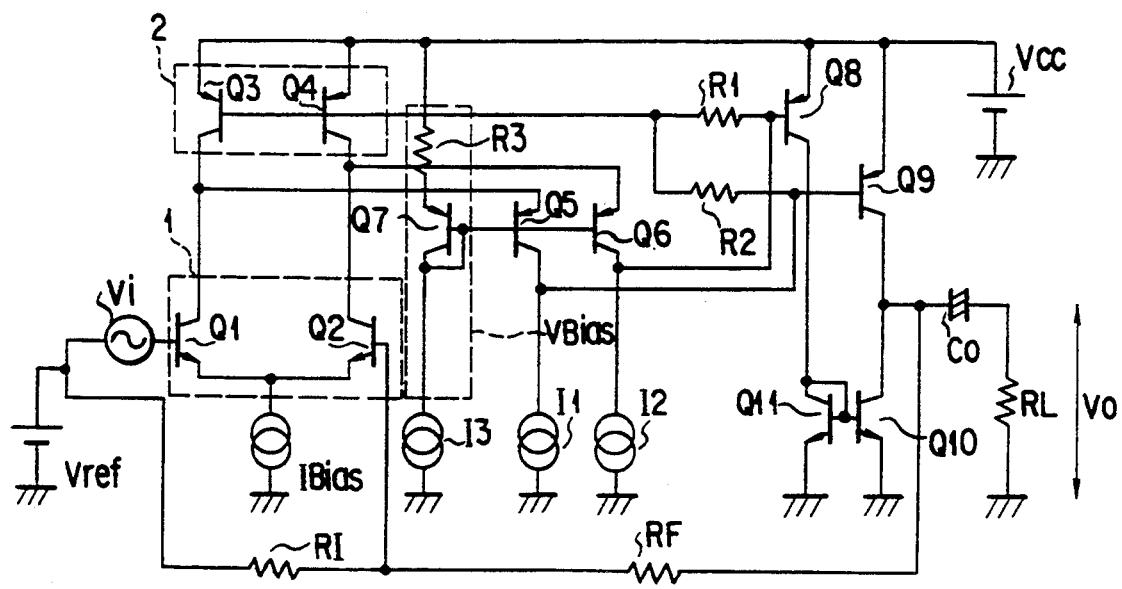
FIG. 5 is a circuit diagram showing a modified construction of the circuit diagram shown in FIG. 4.

FIG. 5 shows an application of the differential amplifier circuit of the present invention shown in FIG. 4. More specifically, FIG. 5 shows an example in which an emitter ground current amplifying stage having PNP transistors Q8 and Q9 and current mirror circuit having transistors Q10 and Q11 are added to the differential amplifier circuit of FIG. 4, thereby obtaining the structure in which a negative feedback function is added.

In the example shown in FIG. 5, the power source circuit VBias of FIG. 4 is constituted by a series circuit having a resistor R3, a transistor Q7 whose base and collector are diode-connected, and a constant current source circuit I3. In this case, Co represents capacitor, RL is a resistor. Moreover, the same reference numerals are referred to the elements which are the same as those of FIG. 4, and the explanation thereof will be omitted.

In the differential amplifier circuit shown in FIG. 5, current amplification for operating transistors Q8 and Q9 constituting the emitter ground current amplifying stage is performed by the output of the differential pair 1. Due to this, even if the bias current, which is supplied to the transistors Q5 and Q6 constituting the emitter ground current amplifying stage from the differential pair 1, is controlled, the load driving capability is high. Moreover, the transistors Q3 and Q4 constituting the active load circuit 2 and the transistors Q8 and Q9 perform a current mirror operation at the time of non-signal. Due to this, it is possible to reduce the variation of the output current to the variation of the value of the resistors R1, R2 and that of the d.c. current gain.

In the differential amplifier circuit of the present invention, even in the case where a low voltage source is used, an amplifying operation having a high gain can be performed.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A differential amplifier circuit comprising:
   a differential pair including first and second transistors of a first conductivity type, emitters of which are connected to each other;
   a first current source circuit disposed between the emitters of said first and second transistors and a first power source;
   a second current source circuit disposed between a collector of said first transistor and a second power source;
   a third current source circuit disposed between a collector of said second transistor and said second power source; and
   an active load circuit including a third transistor of the first conductivity type, having a collector connected to said collector of said first transistor and an emitter connected to said first power source, a fourth transistor of the first conductivity type, having a collector connected to said collector of said second transistor and an emitter connected to said first power source, a first load resistor disposed between said collector of said third transistor and a common connection node of bases of said third and fourth transistors and a second load resistor disposed between said collector of said fourth transistor and said common connection node of said bases of said third and fourth transistors.

2. The circuit according to claim 1, further comprising a fifth transistor of the first conductivity type having an emitter connected to said first power source and a base connected to a connection node of said first load resistor and said collector of said third transistor, a sixth transistor of the first conductivity type having an emitter connected to said first power source and a base connected to a connection node of said second load resistor and said collector of said fourth transistor, a seventh transistor of a second conductivity type having a collector connected to said collector of said fifth transistor, an emitter connected to said second power source and a base connected to said collector thereof, and an eighth transistor of the second conductivity type having a collector connected to said collector of said sixth transistor, an emitter connected to said second power source and a base connected to said base of said seventh transistor, said eighth transistor constituting a current mirror circuit with said seventh transistor.

3. A differential amplifier circuit comprising:
   a differential pair including first and second transistors of a first conductivity type, emitters of which are connected to each other;
   a first current source circuit disposed between the emitters of said first and second transistors and a first power source;
   an active load circuit including a third transistor of a second conductivity type having a collector connected to said collector of said first transistor and an emitter connected to a second power source, a fourth transistor of the second conductivity type having a collector connected to said collector of said second transistor and an emitter connected to said second power source, a first load resistor, one terminal of which is connected to a common connection node of bases of said third and fourth transistors and the other terminal of which is connected to said first power source via a second current source circuit, and a second load resistor, one terminal of which is connected to said common connection node of the bases of said third and fourth transistors and the other terminal of which is connected to said first power source via a third current source circuit;

a fifth transistor of the second conductivity typed, having a collector connected to said first power source via said second current source circuit and an emitter connected to a connection node of said collectors of said first and third transistors;

a sixth transistor of the second conductivity type, having a collector connected to said first power source via said third current source circuit and an emitter connected to a connection node of said collectors of said second and fourth transistors; and a third power source disposed between said second power source and bases of said fourth and sixth transistors, which outputs a potential having a value lower than that of said second power source by a sum of a base-emitter voltage and a collector-emitter saturation voltage of said third and fifth transistors and said fourth and sixth transistors.

4. The circuit according to claim 3, further comprising an eighth transistor of a second conductivity type having an emitter connected to said second power source and a base connected to said first resistor, and a ninth transistor of the second conductivity type having an emitter connected to said second power source and a base connected to said second resistor, a tenth transistor of the first conductivity type having a collector connected to a collector of said eighth transistor and an emitter connected to said first power supply source, and an eleventh transistor of the first conductivity type having a collector connected to a collector of said eighth transistor and an emitter connected to said first power supply source constituting a current mirror circuit with said tenth transistor.

5. The circuit according to claim 3, wherein said third power source is composed of a series circuit having a resistor and a seventh transistor of the second conductivity type.

* * * * *